United States Patent [19]

Uhlig et al.

[11] 4,266,006
[45] May 5, 1981

[54] PROCESS FOR THE MANUFACTURE OF IMAGED ARTICLES

[75] Inventors: Fritz Uhlig; Kurt A. Wehlmnn, both of Wiesbaden, Fed. Rep. of Germany

[73] Assignee: Hoechst Aktiengesellschaft, Fed. Rep. of Germany

[21] Appl. No.: 961,439

[22] Filed: Nov. 16, 1978

Related U.S. Application Data

[63] Continuation of Ser. No. 728,142, Sep. 30, 1976, abandoned.

[30] Foreign Application Priority Data

Oct. 1, 1975 [DE] Fed. Rep. of Germany ....... 2543820

[51] Int. Cl.³ .................... G03C 5/00; C08F 8/00; C08F 2/46; B05D 3/06
[52] U.S. Cl. ........................ 430/300; 430/1; 430/311; 430/320; 430/322; 430/945; 204/159.16; 204/159.17; 204/159.19; 204/159.2; 204/159.21; 204/159.22; 427/43.1; 427/53.1; 427/96; 427/336
[58] Field of Search ............. 96/48, 90, 115 P; 204/159.12, 159.13, 159.14, 159.19, 159.2, 159.23, 159.16, 159.17, 159.21, 159.22; 427/43.1, 53.1, 54.1, 336, 96, 145; 430/1, 300, 311, 320, 322, 945

[56] References Cited

U.S. PATENT DOCUMENTS

| | | | |
|---|---|---|---|
| 3,554,886 | 1/1971 | Colomb et al. | 204/159.12 |
| 3,884,696 | 5/1975 | Bowdin et al. | 96/35 |

OTHER PUBLICATIONS

*Derwent Publications Ltd.*, DT 2231–815, 1972.
*Derwent Publications Ltd.*, BE–798093, 1972.
*Derwent Publications Ltd.*, DT 2340–325, 1972.
1,263,091 *Information Recording Device*, German 14.3.68, vol. 8, No. 16.

*Primary Examiner*—Michael R. Lusignan
*Attorney, Agent, or Firm*—James E. Bryan

[57] ABSTRACT

This invention relates to a process for the manufacture of an imaged article which comprises:
(a) imagewise irradiating with laser light a material comprising a carrier having on a surface thereof a layer comprising at least one non-photosensitive material, and
(b) removing non-irradiated areas of said layer by treating the layer with a developer in which said non-irradiated areas are soluble but in which irradiated areas are insoluble due to modification of said non-photosensitive material by the laser light.

7 Claims, No Drawings

PROCESS FOR THE MANUFACTURE OF IMAGED ARTICLES

This is a continuation, of application Ser. No. 728,142, filed Sept. 30, 1976, now abandoned.

This invention relates to a process for the manufacture of imaged articles, for example planographic printing forms, relief printing forms, intaglio printing forms, screen printing forms, tanned images or printed circuit boards.

In order to photomechanically manufacture planographic printing forms, the normal procedure is to expose imagewise a copying material comprising a support bearing a photosensitive layer, for example a layer containing a diazo compound, diazido compound or photopolymerizable compound, and then to develop it with a suitable developer solution, whereby a printing form comprising oleophilic image areas and hydrophilic non-image areas is obtained. The oleophilic image areas are normally the areas of the layer which remain after development, while the non-image areas are the areas of the support surface bared by development.

It has been proposed in German Offenlegungsschrift No. 2,231,815, to irradiate recording materials, comprising a support bearing a non-photosensitive layer, with electrons, and then to develop them. Offset printing forms can be manufactured by this process. However, the process has the disadvantage, above all in the case of sizable print formats, that the electron irradiation must be carried out in a high vacuum, which entails the use of expensive apparatus.

German Offenlegungsschrift No. 2,340,323, discloses a process for the manufacture of planographic printing forms in which a carrier covered with a non-photosensitive hydrophilic layer is irradiated imagewise with electrons and is used directly, without a further development step, for printing in a planographic printing machine.

German Auslegeschrift No. 1,263,091, discloses a device preferably for recording video images on about 5 μm thick films coated, by vapor deposition with, for example, cadmium or zinc layers having a thickness of about 0.05 μm, in which laser beams are used to vaporize imagewise the thin metal layers.

Such a material would not be suitable for use in the manufacture of offset printing forms.

German Offenlegungsschrift No. 2,318,133, discloses a process for the production of polymeric image areas by means of laser beams, but this requires a layer having a photocurable composition.

German Auslegeschrift No. 1,571,833, discloses a process for the production of planographic printing forms or hectographic printing forms, in which a laser beam or electron beam is used imagewise to destroy a silicone layer having poor adhesion to a support.

U.S. Pat. No. 3,664,737, discloses a printing plate which carries a photosensitive layer, preferably a diazo layer, and which is irradiated with lasers.

Finally, German Patent Application No. P 24 48 325.8-51 discloses a process for the manufacture of planographic printing forms in which a carrier bearing a hydrophilic layer of a non-photosensitive compound is irradiated imagewise with laser beams and the irradiated material is used, without further treatment steps, for printing in a planographic printing machine.

The present invention provides a process for the manufacture of an imaged article which comprises at least:

(a) imagewise irradiating with laser light a material comprising a carrier having on a surface thereof a layer comprising at least one non-photosensitive material (as hereinafter defined), and (b) removing non-irradiated areas of the layer by treating the layer with a developer in which the non-irradiated areas are soluble but in which irradiated areas are insoluble by virtue of modification of the non-photosensitive material by the laser light.

The process according to the invention provides a novel and unusually simple method of manufacturing, for example, planographic printing forms. The recording material used is insensitive to daylight, ordinary artificial light, ageing, and therefore it can be stored practically indefinitely. While this specification mainly refers to the manufacture of planographic printing forms it will be appreciated that, by making a suitable choice of carrier material and/or by carrying out suitable processing steps subsequent to exposure and development, other articles may be produced.

The term "non-photosensitive material" used herein means a material that is substantially insensitive to relatively low intensity of illumination light in the visible, near ultraviolet and near infrared spectral region (that is to say a material that is not modified to any appreciable extent, either chemically or physically, by such light, especially by the light of conventional copying lamps, i.e. carbon arc lamps, xenon lamps and metal halide lamps, within conventional copying times), but that is sensitive to laser light to the extent that areas of the layer of material struck by the laser light become insoluble in the developer, while areas not so struck are soluble in the developer.

The irradiated and developed plate is mounted in an offset machine and greasy or fatty printing ink and fountain solution may be applied in the usual manner.

The laser irradiation produces a very durable oleophilic printing image, so that long printing runs are frequently achievable.

The non-photosensitive materials are preferably water-insoluble materials, preferably water-insoluble polymeric organic materials having a molecular weight of above about 150. Examples of suitable water-insoluble polymeric organic materials are phenolic resins, formaldehyde resins, e.g. novolaks, epoxy resins, maleate resins, acetal resins, for example, polyvinyl acetals, polyesters, acrylic ester polymers, polyvinyl esters, urea resins, melamine resins, alkyd resins, resols, polyamides, e.g. methoxymethyl-perlon, and styrene polymers, for example polystyrene. Mixtures of these materials may be used. Furthermore, minor amounts of dyestuffs, plasticizers, fatty acids, and/or wetting agents, for example, may be added to the layers.

It is particularly advantageous to add dyestuffs which absorb in the emission region of the laser employed, and thus can act as sensitizers. Examples of such dyestuffs are rhodamines, triphenylmethane dyestuffs, eosin, Astrazone Orange and the like. They are generally used in amounts of 1–80%, preferably 5–40%, of the weight of the layer. Layers which consist entirely or almost entirely of such dyestuffs or pigments can be employed with advantage in the process.

The process of the invention is particularly suitable for the manufacture of offset printing forms, and for producing such articles there may be used a conventional lithographic carrier. Exemplary are carriers comprising paper, zinc, magnesium, aluminum, chromium, copper, brass, steel and multimetallic foils or plastic films. Preferably, aluminum which has been mechanically, chemically or electrolitically roughened and anodized is used; advantageously, the aluminum will have been pretreated with phosphonic acids or derivatives of phosphonic acids as described in German Pat. No. 1,160,733, with an alkali metal silicate as described in German Pat. No. 907,147, or with monomeric and/or polymeric carboxylic acids.

The layer comprising the non-photosensitive material may be formed on the carrier by applying the desired constituents of the layer, in the form of a solution or suspension in a suitable solvent or solvent mixture to the carrier, and then drying the solution which has been applied. Application of the solution to the carrier may be effected by, for example, whirler coating, spraying, dipping or roller application, or with the aid of a liquid film, the method chosen depending, inter alia, on the properties of the carrier material to be coated and/or on the coating solution.

Solvents which may be used for the production of the layers on a commercial scale are liquids generally known as effective solvents, for example alcohols, amides and ketones; ethylene glycol monomethyl ether, ethylene glycol monoethyl ether, dimethylformamide, diacetone-alcohol and buxyrolactone are preferred. To achieve particularly uniform layers, ethers and/or esters, for example dioxane, tetrahydrofuran, butyl acetate or ethylene glycol methyl ether acetate may be added to these solvents.

Though there are no proven concepts of the nature of the change in the materials used brought about by laser irradiation, it can be assumed that a polymerization or crosslinking reaction takes place, with elimination or conversion of hydrophilic groups, for example of OH groups, the conversion being to hyrophobic groups.

As lasers there may be used fairly short-wave lasers of suitable output, for example Ar lasers, krypton ion lasers, dyestuff lasers, yttrium-aluminum-garnet (YAG) lasers and helium/cadmium lasers, which emit approximately between 300 and 600 nm, but for some layers $CO_2$ lasers, which emit at 10.6 $\mu$m, are also suitable.

The laser beam may be controlled by means of a predetermined programmed line motion and/or screen motion. Processes and devices for regulating the laser beam by computers, as well as for the bundling, modulation and deflection of the beam, that may be used in the process of the invention have been disclosed on a number of occasions, for example in German Offenlegungsschriften Nos. 2,318,133, pages 3 et seq., and 2,344,233, pages 8 et seq., and in U.S. Pat. Nos. 3,751,587, 3,745,586, 3,747,117, 3,475,760, 3,506,779, and 3,664,737.

The layers are preferably irradiated imagewise with an argon laser having an output of 3 to 30 Watts or with a $CO_2$ laser. Depending upon the sensitivity or absorption capacity of the layers employed, speeds of up to 110 m, or more, per second may be achieved. By focusing the laser beam with an objective, focal points of less than 50 $\mu$m diameter may be produced on the layers. Since the layers are non-photosensitive, the irradiation can be carried out in daylight.

Examples of suitable developers are alkaline or acid aqueous solutions which contain inorganic salts, weak acids, and, optionally, wetting agents and/or dyestuffs. It is also possible to use aqueous solutions which contain up to about 40% of their volume of lower aliphatic alcohols, for example propanols, or other water-miscible organic solvents.

The non-photosensitive copying material has a very good shelf life even at relatively high temperatures and relatively high atmospheric humidities, and even in light. Furthermore, it exhibits good resistance to the developer, while the non-image areas of the layer can be removed rapidly and cleanly, often by means of an aqueous, non-inflammable developer. The printing forms obtained give a high number of prints.

By varying the composition of the layers and the laser beam conditions the properties of the articles produced can be controlled within a wide range to suit particular applications, such as are required, for example, for automatic printing form manufacture in so-called copy production lines.

The process according to the invention may be used above all for the manufacture of printing forms for planographic printing. After developing, however, the copying material may be converted by etching into a relief printing form or intaglio printing form, or be converted to an offset multi-metallic printing form. The copying compositions equally may be used for the manufacture of printed circuits, screen printing forms, tanned images and the like.

The following Examples further illustrate the invention. Unless stated otherwise, percentages quoted are percent by weight. The relationship between parts by weight and parts by volume is the same as that between grams and milliliters.

EXAMPLE 1

Using a continuous band process, a bright-rolled aluminum foil is electrochemically roughened, anodized, pretreated with a 2% solution of polyvinylphosphonic acid in water and dried.

The band is then coated with a 3% solution of a non-plasticized urea-formaldehyde resin (dynamic viscosity 1,260 cP at 25° C.) in ethylene glycol monomethyl ether, dried, and cut to appropriate formats.

The material is then irradiated imagewise with an argon ion laser having a total output of 15 Watts over all spectral lines. Imagewise irradiation is carried out at a speed of at least 350 cm/sec., at a current intensity of 25 amperes.

The material is then wiped over with a mixture of 60% of water and 40% of ethylene glycol monoethyl ether, whereby the parts of the layer which have not been struck by the laser beam are removed and the hydrophilic aluminum surface is bared. In the areas which have been struck by the beam, the resin layer is completely insoluble in the developer used, and accepts ink. In an offset printing machine, this printing form gives several thousand prints.

Instead of the urea resin of relatively low viscosity used above, it is also possible to employ, with comparably good results, urea-formaldehyde resins which have viscosities of 2,100 or 3,650 cP at 25° C. Acid-curable urea-formaldehyde resins are also suitable.

EXAMPLE 2

An aluminum band pretreated as in Example 1 is coated with a solution of 5% of an unplasticized urea resin and 1% of eosin in ethylene glycol monoethyl ether, dried, and cut to appropriate formats.

The material is irradiated imagewise with an Ar laser of 25 Watts at a speed of 80 m/sec and is developed as described in Example 1.

Instead of the dyestuff eosin, it is also possible to employ, with success, Rhodamine B extra [(C.I. 45,170), 6 G (C.I. 45,160) or 6 GDN (C.I. 45,160)], Crystal Violet or Astrazone Orange G (C.I. 48,035), which act as sensitizers and hence permit the speed of irradiation to be increased.

EXAMPLE 3

An aluminum plate 0.3 mm thick is mechanically roughened by brushing and is dipped for 3 minutes in 20% trisodium phosphate solution at 70° C.; it is then rinsed with water, treated for 15 seconds with 70% nitric acid, again rinsed with warm water, pretreated for 3 minutes in 2% sodium silicate solution at 85° C., rinsed with water, and then dried. This pretreated plate is coated with a solution of 5% of a cresol-formaldehyde novolak having a melting range of 110–118° C., 1% of Crystal Violet in 74% of ethylene glycol monomethyl ether, and 20% of butyl acetate, and dried.

It is irradiated imagewise with a 25 Watt argon laser at 20 amperes and at a speed of at least 350 cm/sec and developed with a solution of 40% of ethylene glycol monoethyl ether and 60% of 0.1% hydrochloric acid. The irradiated areas thereafter can be inked with a fatty ink and the form is ready for printing.

EXAMPLE 4

An aluminum plate roughened by wet brushing is coated with a 2% solution of an epoxide resin having an epoxide equivalent weight of 450–500 and a melting range of 64–74° C. (Durran Hg method), and irradiated with the argon laser used in example 3 at 32 ampere current intensity. It is developed with a mixture of 40% of ethylene glycol monoethyl ether and 60% of sulfuric acid (10%). Thereafter the plate is ready for printing.

EXAMPLE 5

An aluminum-chromium bimetallic plate is coated on the Cr surface with a solution of 3% of a copolymer, containing carboxyl groups, of styrene and maleic anhydride, having an acid number of 180 and a mean molecular weight of about 20,000, and 3% of Crystal Violet, in ethylene glycol monomethyl ether. It is irradiated with the argon laser used in example 3 at 32 A and developed with an aqueous solution which contains 5% of sodium metasilicate nonahydrate, 3% of trisodium phosphate dodecahydrate and 0.4% of monosodium phosphate. The irradiated image areas are oleophilic and the form is ready for printing in an offset machine.

EXAMPLE 6

The aluminum carrier according to Example 1 is coated with a solution of 5% of colophony and 1% of Rhodamine B in ethylene glycol monomethyl ether, dried, and irradiated imagewise with the Ar laser used in example 3 at 32 A. It is developed with an aqueous solution of 2% of sodium metasilicate nonahydrate and 1% of trisodium phosphate dodecahydrate.

In place of colophony, casein or shellac can be employed with comparable success.

EXAMPLE 7

Roughened and anodized aluminum is coated with a solution of 3% of a low molecular weight copolymer of methyl methacrylate and methacrylic acid having an acid number of about 80 and 0.1% of Astrazone Orange R (C.I. 48,040) in ethylene glycol monoethyl ether and the coating is then dried.

After irradiation, as described in Example 6, the material is first wiped over with 1% phosphoric acid and then developed with the aqueous alkaline solution described in Example 6.

Instead of the copolymer, polyacrylic acid, polymethacrylic acid or mixtures thereof can be employed with comparable success.

EXAMPLE 8

Anodized aluminum is coated with a 1% solution of the phthalocyanine dyestuff Pigment Green 7 (IR spectrum No. 2,547 in "Atlas der Kunststoffanalyse" ("Atlas of Plastics Analysis"), Volume II, by Hummel/Scholl) in dimethylformamide, the coating is dried and then irradiated imagewise with a 200 Watt $CO_2$ laser. By focusing with an objective, a focal point of less than 50 $\mu$m diameter is achieved, with a power density of about 10 Megawatts/cm$^2$. The printing form is then developed with aqueous 5% orthophosphoric acid, and inked; it is then ready for printing.

Similar results are achieved if, instead of the above-mentioned dyestuff, which has an absorption maximum in the emission range of the $CO_2$ laser at about 10.6 $\mu$m, the following dyestuffs which have a similar absorption are employed: Permanent Yellow GR (C.I. 21,100), Hansa Yellow 5 G (C.I. 11,660) dissolved in cyclohexanone, Permanent Yellow NCG (C.I. 20,040) in dimethylformamide, Thioflavin TCW (C.I. 49,005) in ethylene glycol monomethyl ether, or Pigment Green 8 (C.I. 10,006).

EXAMPLE 9

An aluminum foil which has been anodized and pretreated in accordance with Example 1 is coated with a suspension of 1% of Permanent Yellow GR (C.I. 21,100) in ethylene glycol monomethyl ether, the coating is dried, irradiated, and developed as indicated in Example 8.

Similar results are obtained with Indanthrene Brilliant Rose 3 B (C.I. 60,005).

It will be obvious to those skilled in the art that many modifications may be made within the scope of the present invention without departing from the spirit thereof, and the invention includes all such modifications.

What is claimed is:

1. A process for the manufacture of an imaged article which comprises:
   (a) imagewise irradiating with laser light a material comprising a carrier having on a surface thereof a layer consisting essentially of at least one polymeric material insensitive to non-coherent light, said layer being water-insoluble and insensitive to low intensity light in the visible, near ultraviolet and near infrared spectral region, and said laser having a minimum power sufficient to form an image in said layer, and
   (b) removing non-irradiated areas of said layer by treating the layer with a developer in which said non-irradiated areas are soluble but in which irradiated areas are insoluble due to modification of said non-photosensitive material by the laser light.

2. A process as claimed in claim 1 wherein said laser minimum power is about 1.1 joules/cm$^2$.

3. A process as claimed in claim 1 wherein said polymeric material has a molecular weight above about 150.

4. A process as claimed in claim 3 wherein the polymeric material is selected from the group consisting of melamine resin, urea resin, alkyd resin, phenolic resin, epoxy resin, maleate resin, acetal resin, polyamide, styrene polymer, acrylic ester polymer, polyester polyvinyl ester or formaldehyde condensation resin.

5. A process as claimed in claim 1 wherein said layer comprises a polymeric organic substance having a molecular weight above about 150.

6. A process as claimed in claim 1 wherein the layer comprises at least one dyestuff which absorbs in the emission range of the laser employed.

7. A process as claimed in claim 6 wherein the dyestuff is present in an amount of from 1 to 80% by weight based on the weight of the layer.

* * * * *